United States Patent [19]

Montmarquet

[11] Patent Number: 4,731,156
[45] Date of Patent: Mar. 15, 1988

[54] PLASMA PROCESSES FOR SURFACE MODIFICATION OF FLUOROPOLYMERS USING AMMONIA

[75] Inventor: Francis H. Montmarquet, Little Falls, N.J.

[73] Assignee: ITT Avionics, A Division of ITT Corporation, Nutley, N.J.

[21] Appl. No.: 18,666

[22] Filed: Feb. 25, 1987

[51] Int. Cl.$^4$ .............. B44C 1/22; B29C 37/00; C03C 15/00; C03C 25/06
[52] U.S. Cl. .................... 156/643; 156/646; 156/668; 156/345; 156/272.6; 204/192.36; 252/79.1; 427/39; 427/96; 427/307
[58] Field of Search ............... 156/643, 646, 668, 345, 156/272.6; 252/79.1; 427/38, 39, 96, 307; 204/192.36

[56] References Cited

U.S. PATENT DOCUMENTS

| | | | |
|---|---|---|---|
| 3,030,290 | 4/1962 | Ryan | 156/272.6 X |
| 4,064,030 | 12/1977 | Nakai et al. | 204/298 X |
| 4,344,996 | 8/1982 | Banks et al. | 204/38 B |
| 4,465,547 | 8/1984 | Belke et al. | 156/668 X |

Primary Examiner—William A. Powell
Attorney, Agent, or Firm—Robert A. Walsh; Thomas N. Twomey; Mary C. Werner

[57] ABSTRACT

There is disclosed a method of raising the surface energy of a fluoropolymer to enable one to wet the surface thereby allowing adhesion of various materials to the surface. The method involves placing the fluoropolymer in a sealed chamber while introducing a combination of oxygen and ammonia gas into the chamber at a predetermined pressure range and at a selected rate. A plasma is created in the chamber during the introduction of the gases for an interval sufficient to remove a substantial amount of fluorine from the surface of said fluoropolymer thereby raising the surface energy of the same.

15 Claims, 1 Drawing Figure

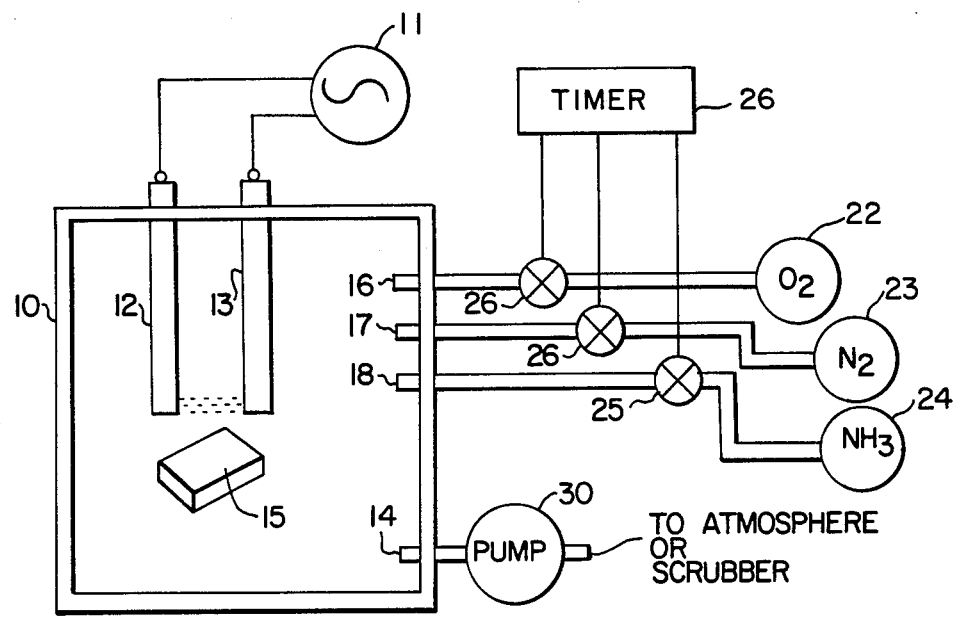

PLASMA PROCESSES FOR SURFACE MODIFICATION OF FLUOROPOLYMERS USING AMMONIA

BACKGROUND OF THE INVENTION

This invention relates to a process for modifying the surface of fluoropolymers used in printed circuit boards and more particularly to a process utilizing a plasma and ammonia for modification of the polymer surface to allow one to plate the surface more efficiently by the use of electroless copper plating techniques.

As is ascertain, printed circuits are widely employed in the electronics industry. Essentially, a printed circuit is a conductive circuit pattern applied to one or both sides of an insulating substrate. The conductive pattern can be formed by any of several techniques after which component lead holes are drilled or punched out in the substrate and components are then installed and soldered in place. Printed circuit construction is ideal for assembly of circuits which employ miniature solid state components.

Its advantages over conventional chassis and point-to-point wiring are many and hence printed circuits are widely employed. In any event, many types of materials are utilized for printed circuit substrate materials and are available in thicknesses varying from 1/64 to ½ inch. Many printed circuit boards for particular application are fabricated with fluoropolymers.

Examples of such fluoropolymers are Teflon which is used in a polytetrafluoroethylene laminate type board (PTFE). Another type of board uses Kel-F which is a polymonochlorotrifluoroethylene compund. Other types of printed circuit boards, as one can ascertain, include Teflon film and so on. In any event, such fluoropolymers are characterized in having a very low surface energy and as such are not readily wetted by aqueous solutions or common inks, adhesives and coatings.

While the above-noted printed circuit boards are indicative of some of the fluoropolymers which are employed favorably with this process, it is indicated that the process to be described may be used with fluoropolymers such as Teflon, as indicated above, fluorinated ethylene-propylene (FEP), fluorinated alkoxyl (TFA), ethylene-tetrafluoroethylene copolymers such as Tefzel (ETFE) and other polymers and copolymers including fluorine including the following brands, Tedlar (Dupont, Kel-F (3 M), Halar (Allied) and Kynar (Pennwalt).

The above-noted materials are sold under trademarks, and essentially the company that manufactures or has the registration has been indicated in parenthesis. In any event, as will be described, the process to be described may be used whenever it is desired to wet such fluoropolymers or improve the adhesion of such materials as plating, inks, adhesives, glues, paints or other coatings. Essentially, the process may be used whenever it is desired to stick something to such materials as fluoropolymers.

In any event, the prior art was cognizant of a need to modify the surface of fluoropolymers such as Teflon and derived many techniques for doing so. One technique involves the use of elemental sodium dissolved or dispersed in a liquid such as a liquified ammonia or proprietary mixtures of solvents. These mixtures work by removing fluorine from the polymer and substitute oxygen and hydrogen when the surface is subsequently exposed to water.

Modification of the polymer surface in this manner allows materials such as plating solutions, adhesives and other coatings to wet the surface. This promotes void free plating and greater adhesion compared to the untreated surface. Certain companies such as the Rogers Corporation of Chandler, Ariz., have utilized what is referred to as a plasma dissmearing operation. In this operation boards are placed in a vacuum chamber. A mixture of fluorocarbon gas and oxygen or pure oxygen is introduced at low pressure. Pure oxygen plasma is used for providing wettability of PTFE. High electrical potential across the electrodes in the chamber ionizes the gas mixture to form a chemically active plasma that removes material from exposed polymeric surfaces.

Under proper conditions this exposure to the plasma will render PTFE surfaces water wettable which is an important characteristic for a successful hole in edge plating. See for an example an article entitled "Through Hole and Edge Plating of RT/duroid ® Microwave Laminate", published by the above-noted corporation under document number 7397-1084-5K. In an article entitled "Keene's Low Loss Printed Circuit Board Laminates for the Microwave Industry" by John S. Taylor, 1984, published by the Keene Corporation, Laminates Division, 1100 Governor Lea Road, Bear, Del. 19701, there is described the treating of holes before plating through with electroless copper.

In the article it is indicated that since Teflon has a low surface energy, the resins do not wet out readily and the use of sodium etching is recommended. In the article it is described that both the sodium naphthelene in organic ethers and the sodium liquid ammonia solution are used for this purpose.

The former type is more convenient for the average user. The reagent may be produced by the user but is probably more convenient to purchase commercially prepared solution such as TETRAETCH from W. L. Gore or FLUOROETCH from Acton Associates. Sodium etching removes fluoride atoms from the surface of the polymer so that the chemically changed and somewhat carbonacious surface form becomes receptive to wetting by certain materials such as tin and paladium containing sensitizers or catalyst solutions. Roughening of holes in printed circuit boards by plasma etching has also been used instead of sodium etching before plating. Vapor honing before sodium etching has been reported to improve plating adhesion.

Hence as one can ascertain from the above-described prior art techniques there are many techniques utilized in the prior art to improve the wettability of fluoropolymers.

In any event, existing methods of modifying the surface of polymers involved the use of sodium as indicated above or employ liquified ammonia or other proprietary mixtures or solvents. The above processes have several short comings including cost, work place hazards and environmental hazards. Preparations of sodium are expensive and have limited shelf life. They give off noxious fumes that workers must be protected from. They are highly reactive and some proprietary mixtures are extremely flammable.

The used mixtures as well as the byproducts must be extensively treated before disposal or handled as a hazardous waste. Hence such techniques including the use of plasma techniques with the above-noted materials have created extremely dangerous byproducts and are expensive and time consuming to utilize.

It is therefore an object of the present invention to provide a process which utilizes a plasma and is capable of modifying the surface of fluoropolymers which operates at reduced pressures and uses gases as reactants. The gases used are oxygen and ammonia. These gases as will be explained are inexpensive and readily available.

It is a further object of this invention to provide a plasma process for modifying the surface of fluoropolymers which process is relatively inexpensive in operation and which process produces byproducts that are easily treated by scrubbing and ph neutralization.

It is a further object of the present invention to provide a process for modifying the surface of fluoropolymers which process is carried out in a vacuum chamber and hence is naturally isolated from the workplace. In this manner the preparation and storage of hazardous mixtures is avoided.

BRIEF DESCRIPTION OF THE PREFERRED EMBODIMENT

A method of raising the surface energy of a fluoropolymer, comprising the steps of placing said fluoropolymer in a sealed chamber, introducing a combination of gases including oxygen and ammonia gas into said chamber within a predetermined pressure range, creating a plasma discharge in said chamber during the introduction of said gases for an interval sufficient to remove a substantial amount of fluorine from the surface of said fluoropolymer to thereby raise the surface energy of said fluoropolymer to allow said fluoropolymer to be wetted.

BRIEF DESCRIPTION OF THE FIGURE

The sole FIGURE is a block diagram depicting the process for raising the surface energy of a typical fluoropolymer.

DETAILED DESCRIPTION OF THE FIGURES

Referring to the FIGURE, there is shown a chamber 10. Essentially, the chamber 10 is readily available equipment as commonly known as a plasma etcher or a reactive ion etcher.

As such these equipment chambers are commercially available and consist of chambers which are capable of being sealed from the atmosphere and are equipped with various ports for connection to vacuum pumps and gas supplies. As shown in the FIGURE, there are two electrodes designated as 12 and 13 which electrodes are located within the chamber 10 and which are coupled to the source of alternating current 11. The source of alternating current is connected to the electrodes 12 and 13 within the chamber and the frequency of the source may range from the low KHz to several hundred MHz. The frequency of operation is well known in the art.

The electrodes as 12 and 13 normally consist of rods, plates, conductive parts of the work being processed, chamber walls or other conductive surfaces. Alternatively, the chamber itself may be a magnitron which is capable of generating high electrical energy at relatively high frequencies. As indicated above, the chamber 10 as well as the associated equipment is well known and exist in the prior art. As one will ascertain, the generator 11 in conjunction with the electrodes 12 and 13 are capable of producing a plasma discharge within the chamber 10. The plasma is a highly ionized gas that does not easily fit into the category of a solid liquid or gas. The ionization of a plasma is maintained primarily by electron collisions and by photo-ionization.

The concentration of positive and negative ions are relatively high and roughly equal. Since the plasma is highly conductive a relatively low voltage gradient exists across it. In general the negative charge carriers are electrons. The neutral gas atoms, ions and electrons are not necessarily in thermal equilibrium, and velocities vary over a wide range. In any event, the theory and operation of plasmas are well known in the art.

Shown in FIG. 1 is a workpiece 15. Essentially, the workpiece 15 may consist of a printed circuit board fabricated from a fluoropolymer and having through holes for eventually receiving a copper plating by an electroless process. Shown coupled to the chamber are various ports such as 16, 17, and 18 as well as port 19. As seen from the FIGURE, ports 16 and 18 are connected to sources of gas such as sources 22, 23, and 24 which as will be explained accommodate oxygen, nitrogen and ammonia.

Each gas source which may be a pressurized vessel or otherwise is connected via a valve as valves 25 to 27 which valves may be controlled by an electromechanical timer as timer 26. Coupled to port 19 is a suitable vacuum pump as 30 with a vent connected to the atmosphere or a scrubber. In any event, the entire mechanism depicted in FIG. 1 is well known in the art, and as indicated above, such equipment is commonly known as plasma etchers or reactive ion etchers.

Essentially, the chamber 10 is capable of being sealed from the atmosphere and, as indicated above, is equipped at the various ports for connection to the vacuum pump as 30 as well as to the various gas supplies as 22 to 24. In operation a vacuum is drawn on the chamber 10 and the process gas or gases are introduced at a rate that maintains a pressure below one Torr, usually between 0.1 and 0.3 Torr. The rate of gas flow depends on the pumping capacity of the vacuum pump 30 and the desired pressure. Typical rates for chambers as 10 used to process printed circuits are 0.1 to 2 liters per minute at standard conditions. Electric current is applied to the electrodes 12 and 13 via the generator 11 causing a discharge to occur with the chamber. Power requirements depend on the process and the chamber size and typically being 2,000 to 10,000 watts for chambers designed for printed circuits.

The discharge forms a mixture of energetic ions, neutral atoms and molecules. These energetic species react with materials in the chamber forming byproducts that are removed by the vacuum system and discharged in air or scrubbed. This process is commonly known as plasma etching or reactive ion etching. The equipment as indicated are well known and used in both the printed circuit and semiconductor industries to etch various materials including epoxies, polyimides, silicon and aluminum. It is also used to improve the adhesion of inks, coatings and adhesives by plastic processes.

As indicated above, common gases for etching include oxygen, fluorine, chlorine and gases having fluorine or chlorine atoms such as carbon tetrafluoride or carbon tetrachloride. These gases are used alone or in mixtures that may also contain argon, nitrogen, or carbon dioxide. Gases for improving adhesion for plastic include oxygen, argon, nitrous oxide, helium and air. As one can see, the main gases as indicated above which contain fluorine and chlorine are highly toxic, and hence this presents a substantial problem.

In this particular process for surface modification of the fluoropolymers ammonia is used as the main process gas. Specifically, ammonia is used alone or in combination with such gases as oxygen, nitrogen or argon. The use of ammonia provides an improved process for promoting the adhesion of platings, inks, and coatings compared to processes that do not utilize the ammonia gas. It is therefore apparent that the use of ammonia creates a versatile situation which can accommodate all the necessary materials which are eventually used to adhere to the surface of the fluoropolymer workpiece 15.

Plasma processes for preparing fluoropolymer based printed circuits for electroless copper plating that do not use ammonia require secondary processes such as abrasive blasting to avoid problems such as severe peeling and blistering of the copper in the plated through holes. The use of ammonia avoids these problems. Essentially, as will be explained, processes using ammonia have been found that reduce or eliminate peeling and blistering without resorting to abrasive blasting. X-ray photoelectron spectroscopy (XPS) or (ESCA) has shown that the use of ammonia as a gas in a plasma process reduces the fluorine content of the surface of the polymer and increases the oxygen content. The following examples illustrate this effect and have been derived according to the techniques described herein and are shown in detail in the following table.

TABLE I

| PROCESS # | GAS & FLOW ML/MINUTES | PRESSURE (MICRONS) | POWER (WATTS) | TIME (MINUTES) | ATOMIC % FROM XPS ANALYSIS, BALANCE (H.N. etc.) | | |
|---|---|---|---|---|---|---|---|
| | | | | | F | O | C |
| 1 | $O_2$-400 | 140 u | 3800 W | 15 | 44 | 8 | 37 |
| 2 | $N_2O$-400 | 140 u | 3800 W | 15 | 44 | 10.5 | 33 |
| 3 | $O_2$-400 + He-200 | 160 u | 3800 W | 15 | 48 | 8 | 35 |
| 4 | $O_2$-300 $NH_3$-200 | 140 u | 3800 W | 15 | 33 | 19 | 35 |
| 5 | $O_2$-400 | 140 u | 3800 W | 10 | | Followed By | |
| | $NH_3$-200 | 115 u | 3800 W | 5 | 27 | 20 | 36 |

In the above-noted table the letters F, O & C stand respectively for fluorine, oxygen and carbon. The remaining balance consists of hydrogen, nitrogen and other elements. It has been determined that the processes indicated above numbering 4 and 5 have been found to produce superior plating results determined by the absence of voids and peelings. The following process also works well using nitrogen as an additional gas and has also been found to be extremely effective.

TABLE II

| PROCESS # | GAS | FLOW ML/MINUTES | PRESSURE | POWER (WATTS) | TIME (MINUTES) |
|---|---|---|---|---|---|
| 6 | $O_2$ | 400+ | | | |
| | $N_2$ | 140 | 175 u | 3800 W | 15 Followed By |
| | $NH_3$ | 200 + | | | |
| | $N_2$ | 140 + | | | |
| | $O_2$ | 200 | 185 u | 3800 W | 5 |

Essentially, as one can ascertain from the following process, the substrate is first exposed to oxygen and nitrogen for a period of 15 minutes with the requisite flows of 400 milimeters per minute of oxygen and 140 milimeters per minute of nitrogen. This process is then followed by the addition of adding nitrogen to ammonia, $NH_3$ and oxygen at a pressure of 185 microns at a power of 3,800 watts.

It is shown that oxygen ammonia ratios of about 2 to 1 and pressures between 150 to 200 microns are extremely effective to raise the surface energy of a fluoropolymer. As indicated, fluoropolymers have a very low surface energy and as such are not readily wettable by aqueous solutions or common inks, adhesives and coatings. The above-described process may be used with fluoropolymers such as polytetrafluoroethylene (Teflon), fluorinated ethylene-propylene (FEP), fluorinated alkoxyl (PFA), ethylene tetrafluorethylene polymers such as tefzyl (ETFE) and other polymers and copolymers containing fluorine including the following brands as Tedlar, Kel-F, Halar, and Kynar.

The process is particularly suitable for wetting the surface of a fluoropolymer printed circuit board to accommodate electroless plating of terminal apertures. As indicated above, the above-noted process operates at extremely low pressures and utilizes gases which are relatively easy to dissipate or to neutralize thus avoiding the problems attendant with prior art solutions which use obnoxious gases and which processes produce dangerous byproducts.

In view of the above, it is believed that many modifications can be made by one skilled in the art, and such modifications are deemed to be encompassed with the spirit and scope of the claims as appended hereto.

What is claimed is:

1. A method of raising the surface energy of a fluoropolymer, comprising the steps of:
   (a) placing said fluoropolymer in a sealed chamber,
   (b) introducing a combination of gases including oxygen and ammonia gas into said chamber within a predetermined pressure range,
   (c) creating a plasm discharge in said chamber during the introduction of said gases for an interval sufficient to remove a substantial amount of fluorine from the surface of said fluoropolymer to thereby raise the surface energy of said fluoropolymer to allow said fluoropolymer to be wetted.

2. The method according to claim 1, wherein the step of creating a plasma includes applying an electric current to electrodes in said chamber at a given frequency and at a power between 2,000-10,000 watts.

3. The method according to claim 1, wherein the step of introducing said combination of gases includes introducing said gases at a rate of 0.10 to 2 liters per minute.

4. The method according to claim 1, wherein said combination of gases includes nitrogen.

5. The method according to claim 1, wherein oxygen gas is introduced into said chamber at a rate of relatively 300 milliliters per minute at a pressure of 140 microns, with ammonia introduced at a relative rate of 200 millimeters per minute at said pressure of 140 microns with power applied to create said plasma of about 4,000 watts for a period of about 15 minutes.

6. The method according to claim 1, wherein the step of introducing said gases includes first introducing oxygen into said chamber at a relative rate of 400 millimeters per minute at a pressure of about 140 microns and for a period of 10 minutes and then introducing ammonia gas at a relative rate of 200 milliliters per minute at a power of about 115 microns for a period of 5 minutes and creating said plasma during said periods at a pressure of about 4,000 watts.

7. The method according to claim 1, wherein the step of introducing said combination of gases includes,
first introducing a combination of oxygen and nitrogen with said oxygen introduced at a rate of about 400 milliliters per minute and said nitrogen at a rate of about 140 milliliters per minute at a pressure of about 175 microns for a period of 15 minutes and then introducing a combination of ammonia, nitrogen and oxygen with said oxygen and ammonia introduced at a rate of 200 milliliters per minute, and said nitrogen introduced at a rate of 140 millimeters per minute all at a pressure of about 185 microns for an additional period of 5 minutes.

8. The method according to claim 7, wherein said plasma is produced at a power of about 4,000 watts.

9. The method according to claim 1, wherein the oxygen to ammonia ratio is about 2 to 1 in the introduced combination.

10. The method according to claim 1, wherein the pressure range is between 150 to 200 microns.

11. The method according to claim 1, wherein said fluoropolymer is polytetrafluoroethylene (Teflon).

12. The method according to claim 1, wherein said fluoropolymer is fluorinated ethylene-propylene (FEP).

13. The method according to claim 1, wherein said fluoropolymer is ethylene-tetrafluoroethylene (ETFE).

14. The method according to claim 1, wherein said fluoropolymer is a printed circuit board fabricated from a fluoropolymer based compound.

15. The method according to claim 1, wherein the amount of fluorine remaining on said surface after said method is less than 40 percent.

* * * * *